United States Patent
Kodani et al.

[11] Patent Number: 6,007,668
[45] Date of Patent: Dec. 28, 1999

[54] TAB TAPE AND METHOD FOR PRODUCING SAME

[75] Inventors: Kotaro Kodani; Kazuo Koyanagi; Kiyokazu Sato, all of Nagano, Japan

[73] Assignee: Shinko Electric Industries Co., Ltd., Nagano, Japan

[21] Appl. No.: 08/976,614

[22] Filed: Nov. 24, 1997

Related U.S. Application Data

[62] Division of application No. 08/557,899, Nov. 14, 1995, Pat. No. 5,738,928, which is a continuation of application No. 08/101,076, Aug. 3, 1993, abandoned.

[30] Foreign Application Priority Data

Aug. 8, 1992 [JP] Japan .................................. 4-232743

[51] Int. Cl.⁶ .................................................. B32B 31/00
[52] U.S. Cl. ..................... 156/295; 428/141; 428/209; 428/413; 428/414; 428/457; 428/458; 428/674; 428/675; 428/901; 361/748; 361/750; 361/751; 156/60; 156/73.2; 156/249; 156/252; 156/275.7; 156/344
[58] Field of Search ........................ 428/457, 687, 428/209, 901, 138, 458, 601, 596, 626, 621, 622, 672, 674, 131, 615, 141, 413, 414; 361/748, 750, 751; 174/52.4; 437/209; 156/252, 344, 552, 249, 275.7, 295, 73.2

[56] References Cited

U.S. PATENT DOCUMENTS

| | | |
|---|---|---|
| 4,621,278 | 11/1986 | Miura . |
| 4,806,409 | 2/1989 | Walter et al. . |
| 4,997,517 | 3/1991 | Parthasarathi . |

FOREIGN PATENT DOCUMENTS

| | | |
|---|---|---|
| 0 232 108 | 8/1987 | European Pat. Off. . |
| 0 469 920 | 2/1992 | European Pat. Off. . |
| 40 26 822 | 2/1992 | Germany . |
| 2 039448 | 8/1990 | Japan . |
| 3 104250 | 1/1991 | Japan . |
| 4-199650 | 7/1992 | Japan . |

OTHER PUBLICATIONS

Patent Abstracts of Japan, vol. 016, No. 097 (E–1176) Mar. 10, 1992 & JP–A–32 76 739 (Hitachi Ltd.) Dec. 6, 1991 *abstract*.

Patent Abstracts of Japan, vol. 016, No. 084 (E–1172) Feb. 28, 1992 & JP–A–32 70 026 (Fujitsu Limited) Dec. 2, 1991 *abstract*.

Patent Abstracts of Japan, vol. 015, No. 514 (E–1150) Dec. 27, 1991 & JP–A–32 25 935 (Tomoegawa Paper Co. Ltd.) Oct. 4, 1991 *abstract*.

*Primary Examiner*—Deborah Jones
*Assistant Examiner*—Abraham Bahta
*Attorney, Agent, or Firm*—Staas & Halsey

[57] ABSTRACT

A TAB (tape automated bonding) tape of high precision is formed without the deformations of its conductor pattern and the like and which is hermetically sealed with resin. The method for producing a TAB tape includes punching required holes, such as a device hole 14 and the like, in a metal plate 10 coated with an insulating adhesive layer 12 over the area where a conductor pattern is to be formed; and forming a required conductor pattern 24 by bonding a conductor metal foil onto the adhesive layer and by etching the conductor metal foil. Thus, the material cost of this TAB tape can be reduced and the production of this tape is facilitated.

11 Claims, 5 Drawing Sheets

Fig.4(a)
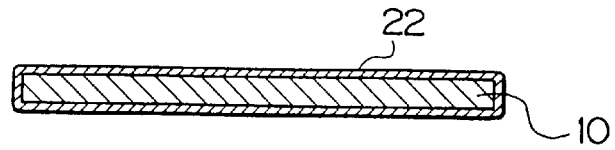
Fig.4(b)
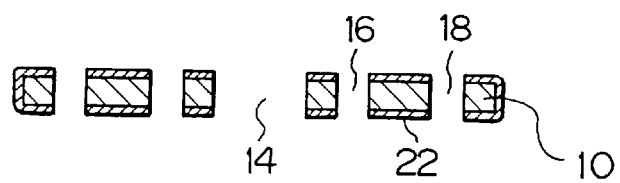
Fig.4(c)
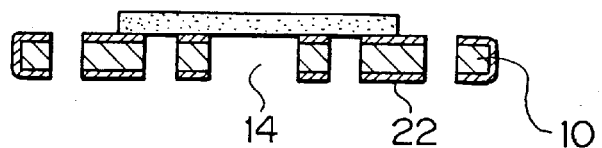
Fig.4(d)
Fig.4(e)
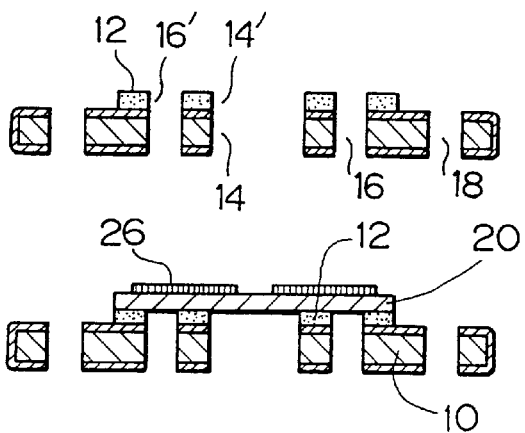
Fig.4(f)
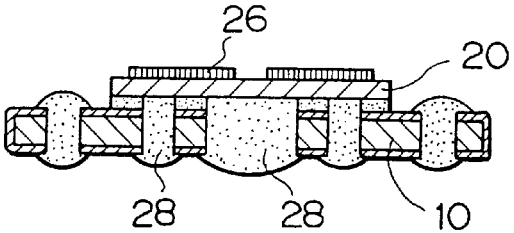
Fig.4(g)
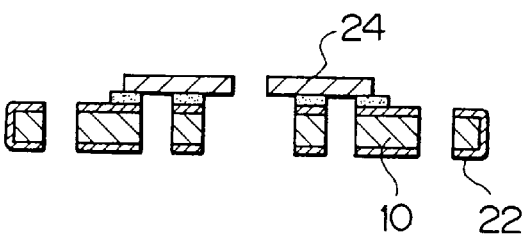
Fig.4(h)
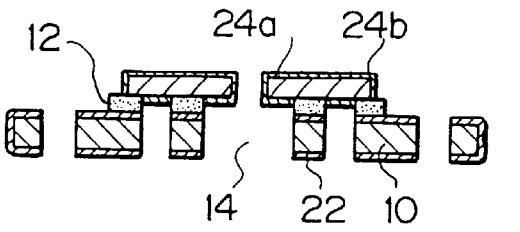

TAB TAPE AND METHOD FOR PRODUCING SAME

This application is a division of application Ser. No. 08/557,899 filed Nov. 14, 1995, now U.S. Pat. No. 5,738, 928, which is a continuation of Ser. No. 08/101,076, filed Aug. 3, 1993, now abandoned.

BACKGROUND OF THE INVENTION

1. Field of the Invention

The present invention relates to a tape automated bonding tape, hereinafter referred to as "TAB tape" and a method for producing the same.

2. Description of the Related Art

A TAB tape known in the art comprises a base film having an electrical insulating property and a conductor pattern formed on the base film. Such a TAB tape is characterized in that it can provide an extremely fine conductor pattern.

For producing a TAB tape, its conductor pattern is made by forming such conductor film as copper foil and the like on base film and then by etching the conductor film in the shape of a required pattern. Since the conductor film is supported on the base film of the TAB tape, it becomes possible to use a conductor film which is much thinner than a conventional metal lead frame and to form a conductor pattern of high-density which cannot be formed by such a conventional metal lead frame.

Because the base film of the TAB tape supports the conductor pattern as mentioned above, this base film itself must have an electrical insulating property. In addition, this base film must have a certain heat-resisting property, since the TAB tape is hermetically sealed with resin after a semiconductor chip is mounted on thereon. Therefore, a heat-resisting plastic film such as polyimide film or the like is used as the base film.

However, such a known TAB tape has the following problems that; the plastic film such as polyimide film or the like used as the base film is relatively expensive material; the base film has moisture-absorbency and this causes cracks in the sealed resin after being hermetically sealed with resin; the adhesiveness between the base film and the sealed resin is not always satisfactory; because of the softness and low rigidity of the base film, the conductor pattern is subject to be deformed; the deformations of the sprocket holes formed in the base film cause insufficient positioning accuracy; and the difference between the coefficient of thermal expansion of the conductor pattern and that of the base film causes warps in the attached condition between the base film and the conductor pattern.

SUMMARY OF THE INVENTION

An object of the present invention is to provide a TAB tape and a method for producing the same, wherein the material cost of the TAB tape can be saved by constituting the TAB tape without using plastic base film such as polyimide film or the like.

Another object of the present invention is to provide a TAB tape and a method for producing the same, wherein the above-mentioned deformation and the like can be prevented by giving a certain rigidity to the TAB tape. Still another object of the present invention is to provide a TAB tape and a method for producing the same, wherein the TAB tape can be advantageously adapted for a hermetically sealed resin or the like.

According to the present invention, there is provided a TAB tape according to the present invention is characterized in that a conductor pattern is formed on a metal plate support with an insulating adhesive layer therebetween.

The TAB tape of the present invention uses a metal plate as a support instead of using such insulating film as polyimide film which composes the base film of a known TAB tape. Since the metal plate and the conductor pattern are made of a identical material such as copper and the like, it is possible to restrain warps and the like of a joined body and to obtain TAB tape products of high quality and high precision.

Furthermore, a method for producing a TAB tape in accordance with the present invention is characterized in that this method comprises forming required holes, such as a device hole and the like, in a metal plate coated with an insulating adhesive layer over the area where a conductor pattern is to be formed; and forming a required conductor pattern by bonding conductor metal foil onto said adhesive layer and by etching said conductor metal foil.

Further, this method is characterized in that it comprises placing the adhesive layer on said metal plate; forming the required holes such as a device hole and the like in said metal plate; bonding the conductor metal foil consisting of the same metal as said metal plate; coating said metal plate with protective plating which is not corroded by the etchant used for etching of said conductor metal foil; and then forming a required conductor pattern by etching said conductor metal foil.

Moreover, this method is characterized in that it comprises placing the adhesive layer on said metal plate; forming the required holes such as a device hole and the like in said metal plate; coating said metal plate with protective plating which is not corroded by the etchant used for etching of the conductor metal foil; bonding said conductor metal foil onto said adhesive layer; and then forming the required conductor pattern by etching said conductor metal foil with said etchant.

Still furthermore, this method is characterized in that it comprises coating said metal plate with protective plating which is not corroded by etchant for the conductor metal foil; forming the required holes, such as a device hole and the like, in said metal plate; placing the adhesive layer on said metal plate; and then forming the required conductor pattern by bonding the conductor metal foil onto said adhesive layer and by etching said conductor metal foil. Copper is used as the material for both of the metal plate and the conductor metal foil.

The metal plate and the conductor pattern are electrically insulated from each other by an insulating adhesive layer. In the case where the metal plate is used as a support for the conductor pattern, the TAB tape is produced by the process which comprises forming a device hole, etching copper foil and the like, in the same way as a known TAB tape in which conventional base film is used.

BRIEF DESCRIPTION OF THE DRAWINGS

FIGS. 4(a) to 4(h) show a third embodiment of a process for producing a TAB tape.

DESCRIPTION OF THE PREFERRED EMBODIMENTS

Referring now to the the accompanying drawings, wherein some preferred embodiments in accordance with the present invention will be described in detail.

The TAB tape according to the present invention is characterized in that a metal plate is used as a support for a conductor pattern instead of a base film made of a known plastic base film (for example, polyimide film or the like) and that the conductor pattern is formed on the metal plate with an insulating adhesive layer therebetween. That is to say, in a conventionally known TAB tape, the insulating adhesive layer functions as a supporting means for the conductor pattern, while, in the TAB tape in accordance with the present invention, a metal plate functions as a supporting means for the conductor pattern.

Figure 1A:
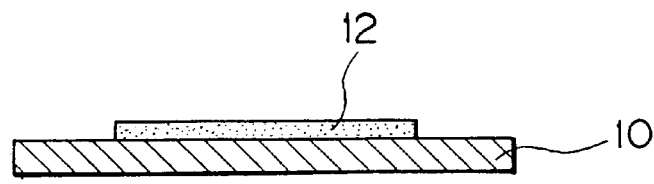
FIGS. 1(a) to 1(f) show a process for producing a TAB tape in a first embodiment of the present invention.

In FIGS. 1(a) to 1(f), a first embodiment of a process for producing a TAB tape in accordance with the present invention is shown. FIG. 1(a) shows a metal plate 10 as a support portion for supporting a conductor pattern. The metal plate 10 is provided in the state in which an adhesive 12 for bonding the conductor pattern to it has been already coated as a thin film. The adhesive 12, which is usually an adhesive tape, must have a high-degree electrical insulating property in order to insulate between the metal plate 10 and the conductor pattern. Although the adhesive 12 is not limited to specific kinds, epoxy resin adhesives or polyimide resin adhesives, for example, can advantageously be used.

In this embodiment, a copper plate being 0.125 mm thick is used as the metal plate 10, and the film thickness of the adhesive 12 is from 20 to 30 $\mu$m. The metal plate 10 is coated with the adhesive 12 in the overall area on which the conductor pattern is to be formed.

Figure 1B:
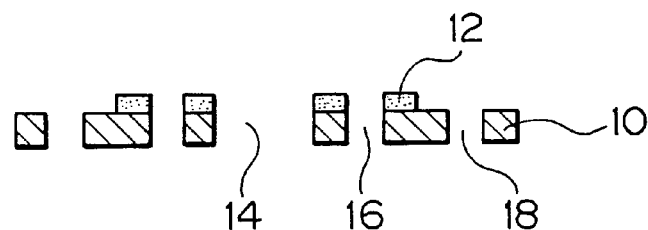

Then, as shown in FIG. 1(b), a device hole 14, window holes 16 and sprocket holes 18 are formed in the metal plate 10 on which the adhesive 12 is applied. These holes are simultaneously formed by a punching process.

Figure 1C:
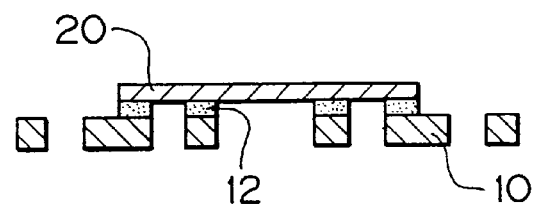

Then, as shown in FIG. 1(c), a copper foil 20 is laminated, by a conventional laminating method or roll-coating method, onto the metal plate 10 having the required holes, such as the device hole 14 and the like, formed as mentioned above. In other words, the copper foil 20 is bonded to the metal plate 10 by the adhesive 12 on the metal plate 10 so that the copper foil 20 is laid over each of the holes, except for the sprocket holes 18. After the copper foil 20 is adhered onto the adhesive 12, the tape in heated so that the adhesive 12 is cured.

Then, a conductor pattern is formed by etching the copper foil 20 with such etching agent, such as iron chloride, copper chrolide or the like. In this embodiment, however, before etching the copper foil 20, the metal plate 10 is coated with protective plating in order that the plate 10 is prevented from being corroded by the etching agent, as shown in FIG. 1(d).

To perform protective plating, the metal plate 10 is connected to a plating electrode and then electroplating is performed. This makes it possible to form protective plating film 22 only on the metal plate 10. Nickel-electroplating, tin-electroplating, tin and nickel-electroplating, or the like can advantageously be used as protective plating for this purpose.

Figure 1D:
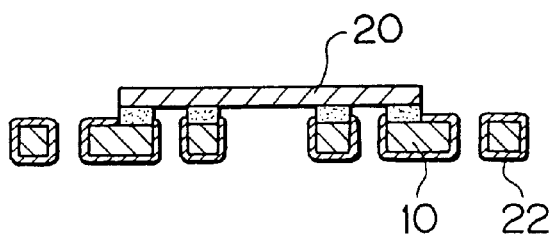
Figure 1E:
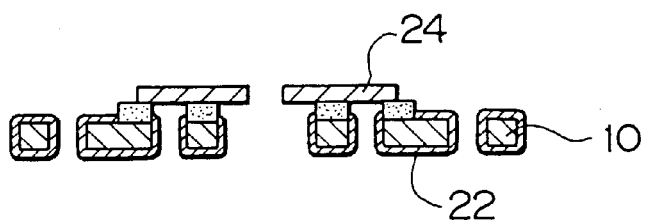

Then, required conductor pattern 24 is formed by etching the copper foil 20 (FIG. 1(e)). The method of etching the copper foil 20 is similar to those currently in use, and this method comprises applying photoresist on the copper foil 20, exposing and developing this photoresist to form a resist pattern, and then etching the copper foil 20 to form a conductor pattern 24.

Moreover, if photoresist is applied in the condition of FIG. 1(d), it is appropriate to fill the device holes 14 and the window holes 16 with photoresist in order that the copper foil 20 is prevented from being etched from its back side.

After the formation of the conductor pattern 24, the portion of the conductor pattern 24 is plated. The main purpose of this plating is to improve the bonding property of its inner lead portion. Tin-plating, solder-plating, nickel/gold-plating and the like are suitable for this purpose.

Figure 1F:
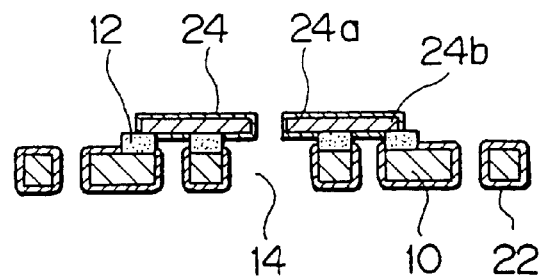
Figure 2:
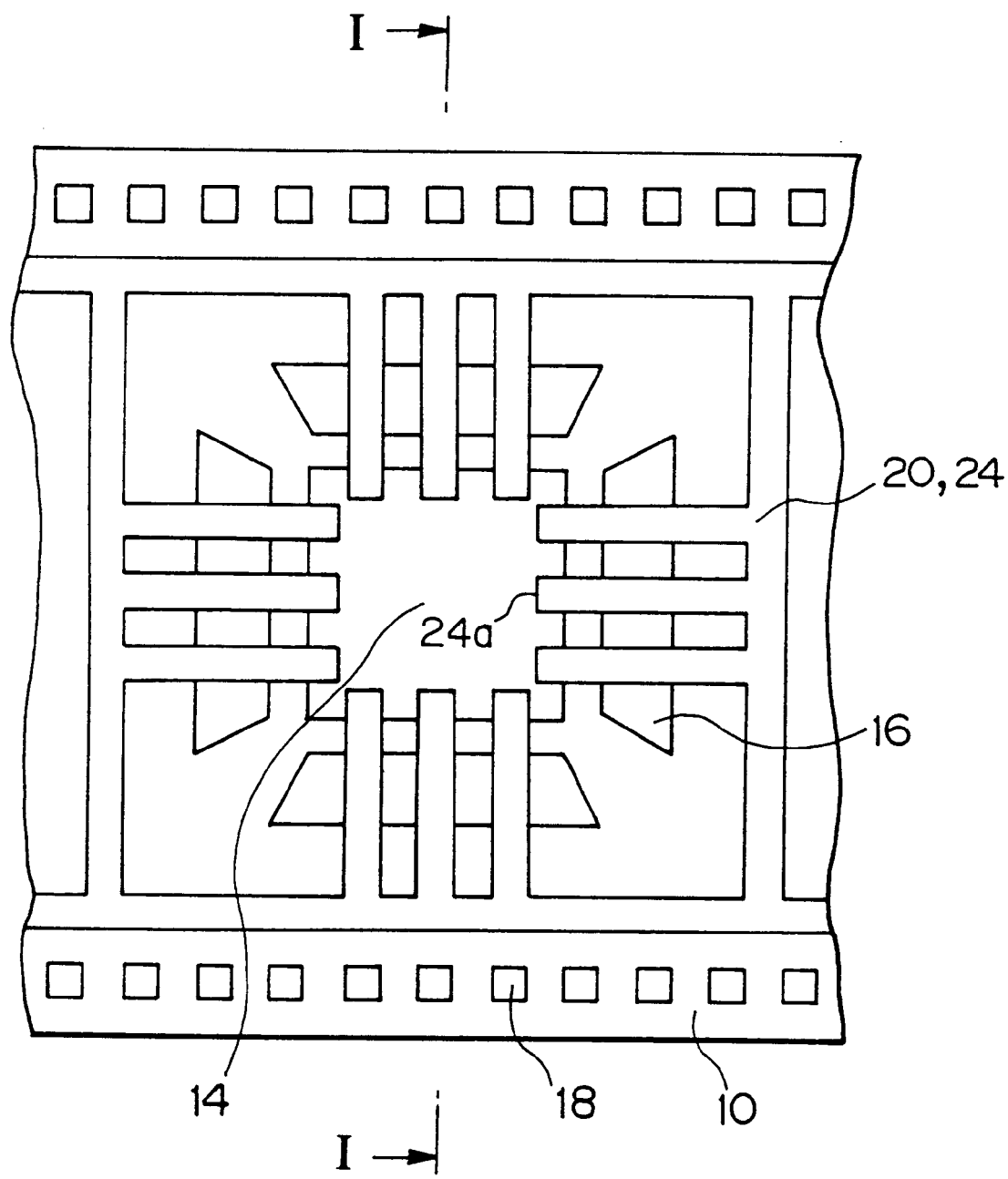
FIG. 2 is a plan view of the TAB tape made in accordance with the first embodiment.

FIG. 2 is a plan view of a product of the TAB tape thus obtained and FIG. 1(f) shows this TAB tape in cross-section along line I—I in FIG. 2. The construction of this product is characterized in that the conductor pattern 24 is supported by the metal plate 10 with the adhesive 12 therebetween. The adhesive 12 insulates the conductor pattern 24 from the metal plate 10. The method for loading a semiconductor chip onto this TAB tape product is similar to that in use for conventional TAB tape products; and it is possible to load a semiconductor chip by joining it to a inner lead 24a with bumps therebetween, so that the semiconductor chip is located in the central device hole 14.

In the first embodiment as described above, since copper is used as the material of the metal plate 10, the metal plate 10 is coated with protective plating in order that this plate 10 is prevented from being etched, simultaneously with the etching of the copper foil 20. However, if the metal plate 10 is made of a metal material which is resistant against the etchant for the copper foil 20, protective plating will not be necessary.

However, in the case in which the material of the conductor pattern 24 and that of the metal plate are different from each other, a problem rises that the TAB tape will become warped because of the difference between their coefficients of heat expansion. Therefore, it is appropriate to use the same metal material for both of the conductor pattern 24 and the metal plate 10. It is generally adequate to use a copper material for the metal plate 10 since the copper material is suitably used for the conductor pattern 24 because of the electrical properties of this material.

Further, conductor metal foil of any suitable material may be used instead of the copper foil 20. In this case, when the same metal material is used for both of the metal plate 10 and said conductor metal foil, it is necessary to perform the same operations as those mentioned above.

Futhermore, since the TAB tape is hermetically sealed with resin after having been loaded with a semiconductor chip, it is required that the TAB tape adheres to the sealing-resin to prevent the exfoliation and the like of the sealing-resin. Therefore it is advantageous to form the surfaces of the metal plate 10 into coarse surfaces. By forming the surfaces of metal plate into coarse surfaces, the bond strength of the adhesive 12 is improved, and reliable support for the conductor pattern 24 is achieved.

FIGS. 3(a) to 3(f) show a second embodiment of the method for producing a TAB tape in accordance with the present invention. This embodiment is substantially the same as the embodiment described above, but is characterized in that the metal plate 10 is coated with the protective plating before the copper foil 20 is bonded onto it.

That is to say, in the embodiment described above in which the metal plate 10 is coated with the protective plating before the copper foil 20 is bonded to it, the layer of the adhesive is so thin (between 20 and 30 $\mu$m) that the electrical conduction between the metal plate 10 and the copper foil 20 may occur and the protective plating may attach to the copper foil 20.

Accordingly, it is the aim of this second embodiment shown in FIG. 2 to avoid the electrical conduction between the metal plate 10 and the copper foil 20 by coating the metal plate 10 with the protective plating before bonding the copper foil 20 to it.

Figure 3A:
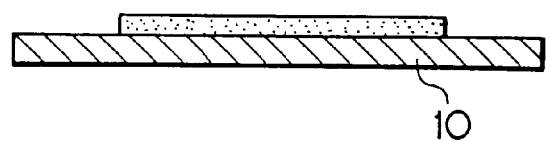
FIGS. 3(a) to 3(f) show a second embodiment of a process for producing a TAB tape.
Figure 3B:
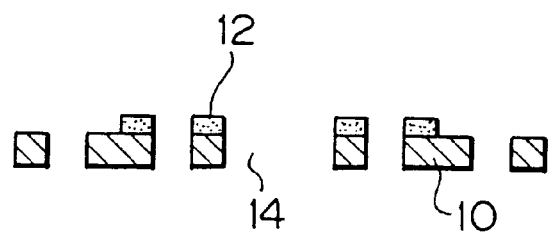
Figure 3C:
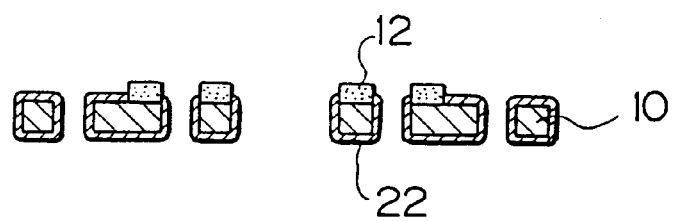

FIG. 3(a) shows the metal plate 10 which is used as a support for the conductor pattern and which is provided after being coated with the adhesive 12. This metal plate 10 undergoes a punching process for the formation of the device hole 14 and the like (FIG. 3(b)).

Then, in order that the metal plate 10 is prevented from being corroded by the etchant, protective electroplating is applied to the metal plate 10 in which the device hole 14 and the like have been formed. The protective plating film 22 is formed over the metal plate 10 except for the area having adhesive 12 on it (FIG. 3(c)).

Figure 3D:
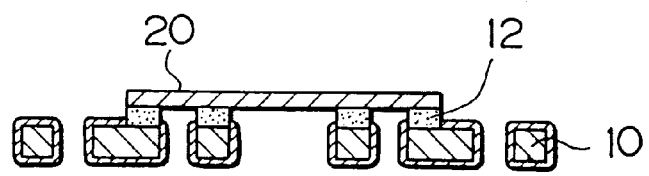
Figure 3E:
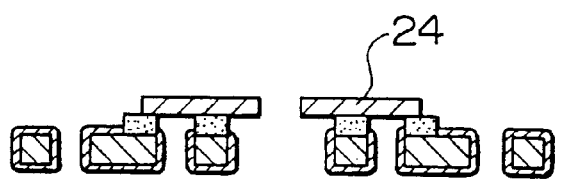

Furthermore, the copper foil 20 is bonded onto the metal plate 10 (FIG. 3(d)), the adhesive 12 is cured by a heating process, the copper foil 20 is etched in the shape of the required pattern, and then, as a result, the conductor pattern 24 is formed (FIG. 3(e)). The method for etching the copper foil 20 and the other processes are the same as those of the first embodiment described above.

Figure 3F:
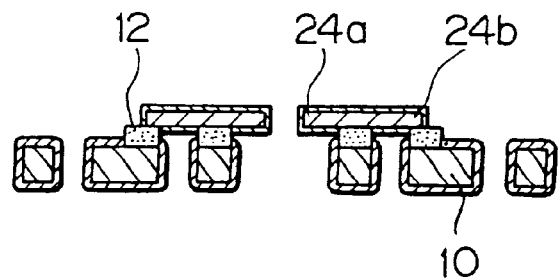

Finally, the conductor pattern 24 is plated and the TAB tape is obtained (FIG. 3(f)). The shape of the product thus obtained is substantially the same as that obtained by the method of the first embodiment as described above.

FIGS. 4(a) to 4(h) show a third embodiment of the method for producing a TAB tape in accordance with the present invention. This embodiment is characterized in that the metal plate 10 is previously coated with the protective plating and the adhesive 12 is applied to this metal plate 10 having the protective plating on it. Such protective plating may be either electroplating or electroless plating.

In each of the above-mentioned first and second embodiments, since the metal plate 10 is coated with the protective plating after being coated with the adhesive 12, there is a possibility that the protective plating attaches to the portion of the adhesive 12 and, as a result, the electrical insulating function provided by the adhesive 12 is hindered. In this third embodiment, the metal plate 10 is previously coated with the protective plating in order that the electrical insulating function of the adhesive 12 can be prevented from being hindered.

FIG. 4(a) shows the metal plate 10 coated with the protective plating. The purpose of this protective plating is, as described above, to prevent the metal plate 10 from being corroded during etching of the copper foil 20. Such required holes as the device hole 14 and the like are formed by a punching process in the metal plate 10 coated with the protective plating (FIG. 4(b)).

Furthermore, the adhesive 12 is applied or laminated to the required area on the metal plate 10 (FIG. 4(c)). Then, the adhesive 12, usually adhesive tape, is formed with device hole 14' and window holes 16' corresponding to the device hole 14 and the window holes 16 of the metal plate 10 (FIG. 4(d)). In this case, device hole 14' and window holes 16' may be formed so as to be smaller than the device hole 14 and window holes 16, respectively, as will be described later with reference to FIG. 5(e). Then, the copper foil 20 is bonded on the metal plate 10 by means of the adhesive 12. The adhesive 12 is than cured by a heating process.

FIG. 4(e) shows the condition in which a resist pattern 26 has been formed on the top of the copper foil 20. This resist pattern 26 is used for the etching of the copper foil 20 in the shape of its required pattern.

In the third embodiment, the device hole 14 and the like are formed by a punching process in the metal plate 10 previously coated with the protective plating. Consequently, the inner sides of each of the hole portions such as device hole 14 and the like are not coated with the protective plating. As indicated in FIG. 4(f), when the copper foil 20 is to be etched, the hole portions of the metal plate 10 are filled with protective resist 28 at the same time that the resist pattern is formed, and the etching of the copper foil 20 is performed so that the etching of the metal plate 10 can be prevented.

FIG. 4(g) shows the condition in which the protective resist 28 has already been removed after the etching of the copper foil 20 and the formation of the conductor pattern 24.

After the formation of the conductor pattern 24 is accomplished as described above, the conductor pattern 24 is plated and a TAB tape product is obtained (FIG. 4(h)). In the same manner as the TAB tape products of the other embodiments mentioned above, this TAB tape product obtained has the construction in which the metal plate 10 supports inner leads 24a and outer leads 24b with the adhesive 12 between the metal plate and these leads.

However, this third embodiment is different from the first and second embodiments mentioned above in that the adhesive 12 is located on the protective plating film 22 and in that the protective plating film 22 is not formed on the inner walls of the hole portions such as the device hall 14 and the like of metal plate 10.

FIGS. 5(a) to 5(h) show a fourth embodiment of the method for producing a TAB tape in accordance with the present invention. This embodiment is characterized in that the metal plate 10 is first formed with required holes, such as a device hole 14, window holes 16 and sprocket holes 18, before the metal plate 10 is coated with the protective plating.

Figure 5A:
FIGS. 5(a) to 5(h) show a fourth embodiment of a process for producing a TAB tape.
Figure 5B:
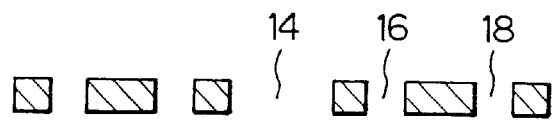
Figure 5C:
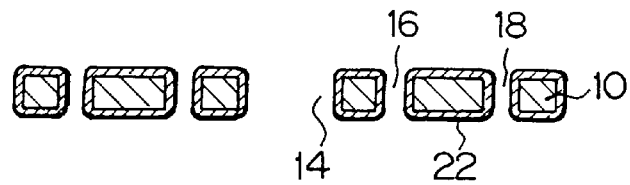

FIG. 5(a) shows the metal plate 10. Then, the required holes, such as the device hole 14, the window holes 16 and the sprocket holes 18, are formed by a punching process in the metal plate 10 (FIG. 5(b)). Then, the metal plate 10 is coated with the protective plating 22 (FIG. 5(c)). The purpose of this protective plating is the same as described above. However, this embodiment is different from the previous, third embodiment that the protective plating film 22 is also formed on the inner walls of the hole portions such as the device hall 14 and the like of metal plate 10.

Figure 5D:
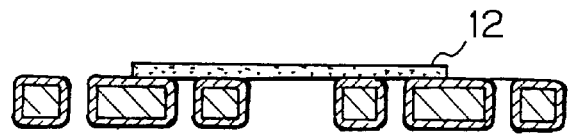
Figure 5E:
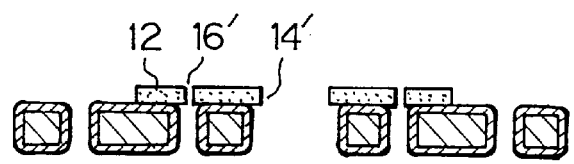

Then, the adhesive 12 is applied or laminated to the required area on the metal plate 10 (FIG. 5(d)). Then, the adhesive 12, usually adhesive tape, is formed with device hole 14' and windows holes 16' corresponding to the device hole 14 and the windows holes 16 of the metal plate 10 (FIG. 4(e)). In this case, device hole 14' and windows holes 16' of the adhesive tape 12 are formed so as to be smaller than the device hole 14 and windows holes 16 of the metal plate 10, respectively, so that the inside edge of the device hole 14' of the adhesive 12 extends by about 0.2 mm from the inside edge of the device hole 14 of the metal plate 10 and, in the same manner the inside edge of the window holes 16' of the adhesive 12 also extend by about 0.2 mm from the inside edge of the window holes 16 of the metal plate 10. Then, the copper foil 20 is bonded on the metal plate 10 by means of the adhesive 12. After the copper foil 20 is adhered to the adhesive 12, the tape is headed so that the adhesive 12 is cured.

Figure 5F:
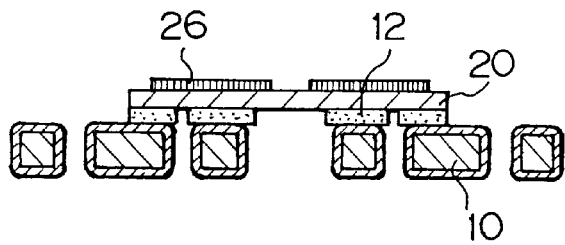

FIG. 5(f) shows the condition in which a resist pattern 26 has been formed on the top of the copper foil 20.

Figure 5G:
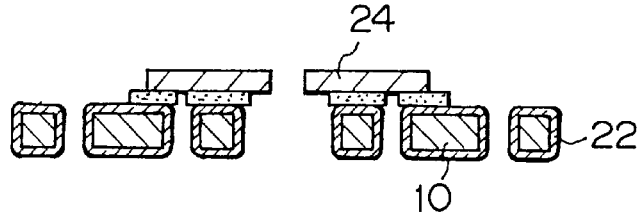

In the fourth embodiment, the device hole 14 and the like are formed by a punching process in the metal plate 10 before the metal plate 10 is coated with the protective plating 20. Consequently, the inner sides of each of the hole portions such as device hole 14 and the like are also coated with the protective plating and, in addition, such holes are also protected by the extended portions (14' and 16') of the adhesive 12. In FIG. 5(g), the etching of the copper foil 20 is performed so that the etching of the metal plate 10 can be prevented by the protective plated film 22 and also the extended portions (14' and 16') of the adhesive 12.

Figure 5H:
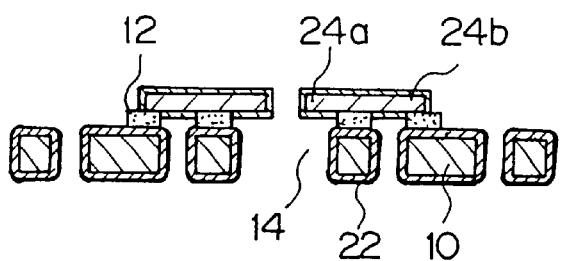

After the conductor pattern 24 is formed by an etching process, as described above, the conductor pattern 24 is plated and a TAB tape product is obtained (FIG. 5(h)). In the same manner as the TAB tape products of the other embodiments mentioned above, this TAB tape product obtained has the construction in which the metal plate 10 supports inner leads 24a and outer leads 24b with the adhesive 12 between the metal plate and these leads.

In this fourth embodiment, since the inner sides of each of the hole portions, such as device hole 14 and the like, are also coated with the protective plating and, in addition, such holes are also protected by the extended portions (14' and 16') of the adhesive 12, as described above, the possibility of a short circuit or an electric leakage between the conductor pattern 24 and the metal plate 10 can significantly be reduced.

In each of the embodiments mentioned above, the TAB tape product was that having a single layer of conductor pattern 12 placed on the metal plate 10, while an additional adhesive layer having an electric insulating property in the same way as the adhesive layers of the embodiments mentioned above can be placed between the layers in order that a multilayer conductor pattern is achieved.

The methods for producing a TAB tape product shown in each of the embodiments mentioned above are substantially the same as the known methods for producing TAB tape products which use such base film as polyimide film and the like having an electrical insulating property. Consequently, the method according to the present invention is characterized in that the current production equipment for producing TAB tapes can effectively be utilized for the production of the TAB tapes in accordance with the present invention. Therefore, a waste of this equipment can be avoided.

Furthermore, since the TAB tape in accordance with the present invention uses a metal plate instead of such known base film as polyimide film or the like, this TAB tape has following advantages; by using a metal plate, its material cost is made cheaper than in the case where such base film as polyimide or the like is used; the deformation of the conductor pattern can effectively be restrained because the rigidity of the metal plate is higher than that of the base film; and positioning accuracy is improved since the deformation of the sprocket holes can be restrained.

Furthermore, in a known TAB tape the conductor pattern is supported on the base film and the junction between the two different materials causes warps, but, in contrast, in the TAB tape according to the present invention, the material of the metal plate is the same as that of the conductor pattern, and it becomes possible to restrain the warps caused by the junction between the two different materials. Furthermore, such known base film such as polyimide film or the like has following disadvantages; the adhesion quality between sealing resin and base film is insufficient when the TAB product is hermetically sealed with resin; and the base film material is absorbent. In contrast, in the TAB tape according to the present invention, since a non-absorbent metal plate is used instead of base film, it becomes possible to improve the adhesion quality to the sealing resin and to obtain highly reliable products.

In accordance with the TAB tape and the method for producing it of the present invention, as described above, it is possible to obtain TAB tape products of high quality and high precision and to provide them as products which can be suitably resin-sealed. Since the support member is made of a metal material, the TAB tape can easily be loaded on, such as, a circuit board of a semiconductor device in a state that the support member is bent in a desired shape with the conductor pattern. Furthermore, the method in accordance with the present invention makes it possible to reduce material costs and to produce TAB tape products more simply than known such products without further complicating the producing process. The present invention also provides other remarkable advantages.

It should be understood by those skilled in the art that the foregoing description relates to only a preferred embodiment of the disclosed invention, and that various changes and modifications may be made to the invention without departing from the spirit and scope thereof.

We claim:

1. A process for producing a tape automated bonding tape, comprising the steps of:

forming a device hole, a window hole, or a sprocket hole in a metal plate over an area where a conductor metal foil is to be bonded;

placing an adhesive layer on the metal plate;

bonding a conductor metal foil onto the adhesive layer, wherein the conductor metal foil is the same metal as the metal plate;

coating the metal plate with a protective plating which is not corroded by an etchant which is to be used for etching the conductor metal foil; and forming the required conductor pattern by etching the conductor metal foil with the etchant.

2. A process for producing a tape automated bonding tape according to claim 1, wherein copper is used as the material for both of the metal plate and the conductor metal foil.

3. A process for producing a tape automated bonding tape according to claim 1, wherein the insulating adhesive layer is epoxy resin adhesive or polyimide resin adhesive.

4. A process for producing a tape automated bonding tape according to claim 3, wherein copper is used as the material for both of the metal plate and the conductor metal foil.

5. A process for producing a tape automated bonding tape, said process comprising:

coating a metal plate with protective plating which is not corroded by an etchant which is to be used for etching of the conductor metal foil;

forming a device hole, a window hole, or a sprocket hole in the metal plate;

placing the adhesive layer on the metal plate over an area where the conductor metal foil is to be bonded;

bonding the conductor metal foil onto the adhesive layer; and forming a required conductor pattern by etching the conductor metal foil with the etchant.

6. A process for producing a tape automated bonding tape according to claim 5, wherein after the adhesive layer is placed on the metal plate, the adhesive layer is formed with a corresponding device hole, a corresponding window hole, or a corresponding sprocket hole corresponding to the holes of the metal plate, in such a manner that the holes of the adhesive layer are smaller than those of the metal plate, so that an inside edge of the respective holes of the adhesive layer extend inward from an inside edge of the respective holes of the metal plate.

7. A process for producing a tape automated bonding tape according to claim 5, wherein the device hole, the window hole, or the sprocket hole are filled with protective resist, before the conductor pattern is formed by etching the conductor metal foil.

8. A process for producing a tape automated bonding tape according to claim 5, wherein copper is used as the material for both of the metal plate and the conductor metal foil.

9. A process for producing a tape automated bonding tape, said process comprising:

forming a device hole, a window hole, or a sprocket hole in a metal plate;

coating the metal plate with protective plating which is not corroded by an etchant;

placing the adhesive layer on the metal plate over an area where a conductor metal foil is to be bonded;

bonding the conductor metal foil onto the adhesive layer; and forming a required conductor pattern by etching the conductor metal foil.

10. A process for producing a tape automated bonding tape according to claim 9, wherein after the adhesive layer is placed on the metal plate, the adhesive layer is formed with a device hole, a window hole, or a sprocket hole corresponding to the holes of the metal plate, in such a manner that the holes of the adhesive layer are smaller than those of the metal plate, so that inside edges of respective holes of the adhesive layer extend inward from inside edges of the respective holes of the metal plate.

11. A process for producing a tape automated bonding tape according to claim 9, wherein copper is used as the material for both of the metal plate and the conductor metal foil.

* * * * *